(12) United States Patent
Chung

(10) Patent No.: US 6,821,839 B2
(45) Date of Patent: Nov. 23, 2004

(54) METHOD FOR FABRICATING MIM CAPACITOR

(75) Inventor: Yi Sun Chung, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/331,433

(22) Filed: Dec. 30, 2002

(65) Prior Publication Data

US 2004/0002188 A1 Jan. 1, 2004

(30) Foreign Application Priority Data

Jun. 28, 2002 (KR) .................... 10-2002-0036703

(51) Int. Cl.[7] .......................................... H01L 21/8242
(52) U.S. Cl. .................. 438/240; 438/250; 438/393; 438/396
(58) Field of Search .................. 438/239, 240, 438/250, 396, 393, FOR 430

(56) References Cited

U.S. PATENT DOCUMENTS

| 4,613,546 A | * | 9/1986 | Kuwata et al. ............ 428/336 |
| 6,341,056 B1 | * | 1/2002 | Allman et al. ............ 361/312 |
| 6,451,667 B1 | | 9/2002 | Ning |
| 6,504,202 B1 | * | 1/2003 | Allman et al. ............ 257/303 |
| 6,566,186 B1 | * | 5/2003 | Allman et al. ............ 438/239 |
| 2003/0068858 A1 | * | 4/2003 | Allman et al. ............ 438/253 |
| 2003/0098484 A1 | * | 5/2003 | Kim ............................ 257/307 |

* cited by examiner

Primary Examiner—George Fourson
Assistant Examiner—Joannie A. Garcia
(74) Attorney, Agent, or Firm—Ladas & Parry LLP

(57) ABSTRACT

Disclosed is a method for forming a MIM capacitor, the method comprising steps of: providing a semiconductor substrate formed with a base layer including a metallic pattern; depositing a first metallic layer to be used for a lower electrode on the base layer; depositing a first middle layer on the first metallic layer in order to improve the surface roughness of the first metallic layer and prevent oxidization thereof; depositing a dielectric layer with a high dielectric constant on the first middle layer; depositing a second middle layer on the dielectric layer in order to increase band gap energy; depositing a second metallic layer used for the upper electrode on the second middle layer; and completing the formation of the lower electrode by patterning the first metallic layer.

4 Claims, 4 Drawing Sheets

METHOD FOR FABRICATING MIM CAPACITOR

BACKGROUND OF THE INVENTION

1. Field of the Invention

The present invention relates to a method for fabricating an MIM capacitor, and more particularly to a method for improving leakage current property of an MIM capacitor.

2. Description of the Prior Art

Currently, analog capacitors are being converted from the PIP (Poly-Insulator-Poly) structure to the MIM (Metal-Insulator-Metal) structure. This is because a capacitor for use in an analog circuit with an RF band requires a high quality factor value. In order to achieve this, it is necessary to use a metallic electrode material with little depletion and low resistance for the electrode.

FIG. 1 shows a structure of an MIM capacitor. Similar to a conventional capacitor, the MIM capacitor has a structure including a lower electrode 11, an upper electrode 13 and a dielectric layer 12 interposed therebetween. In this structure, TiN is used for the lower electrode 11 and a material with a high dielectric constant, such as $Ta_2O_5$, is used for the dielectric layer 12.

More specifically, the lower electrode 11 includes a metallic electrode layer, such as a copper layer or an aluminum layer, along with a metallic barrier layer, such as a TiN, TaN, Ta, or Ti layer (preferably a TiN layer), formed on the surface of the electrode metallic layer.

In FIG. 1, a semiconductor substrate 1 is indicated with 11, a base layer with 10, a MIM capacitor with 14, an insulator layer for interposing between the layers with 15, and metallic wires with 16 and 17.

However, the conventional MIM capacitor has a few problems in that its polarity is poor and that its leakage current property is extremely poor. This is because the TiN layer used as the material for the lower electrode has poor surface roughness in respect of its columnar structure, as shown in FIG. 1. Also, this is because the lower electrode is oxidized during a post treatment. The post treatment, such as an $O_2$-plasma treatment or an $O_3$-annealing, should be performed after deposition in order to ensure the leakage current property of the dielectric material, such as $Ta_2O_5$.

In other words, when a positive (+) bias is applied to the upper electrode, a concentration of electric field occurs due to the roughness of the surface of the lower electrode. Accordingly, the leakage current property deteriorates in comparison to a case in which a negative (−) bias is applied to the upper electrode.

SUMMARY OF THE INVENTION

Accordingly, the present invention has been made to solve the above-mentioned problems occurring in the prior art, and an object of the present invention is to provide a method for forming a MTM capacitor capable of preventing inferiority in polarity and the ability to prevent leakage current due to poor surface roughness of a lower electrode and surface oxidization of the lower electrode during an $O_2$ treatment.

In order to accomplish this object, there is provided a method for forming a MIM capacitor, the method comprising steps of: providing a semiconductor substrate formed with a base layer including a metallic pattern; depositing a first metallic layer used for a lower electrode on the base layer; depositing a first middle layer on the first metallic layer in order to improve the surface roughness of the first metallic layer and prevent an oxidization thereof; depositing a dielectric layer with a high dielectric constant on the first middle layer; depositing a second middle layer on the dielectric layer in order to increase band gap energy; depositing a second metallic layer to be used for the upper electrode on the second middle layer; and patterning the first metallic layer to thus complete formation of the lower electrode.

According to an aspect of the present invention, the first and the second middle layers are one selected from a group including a nitride layer, a silicon oxide layer and an aluminum oxide layer. Preferably, the first and the second middle layers are nitride layers.

According to another aspect of the present invention, a nitride layer is deposited with a thickness of between 10 and 200 Å by a PECVD process performed at a temperature of between 300 and 500 degrees Celsius.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
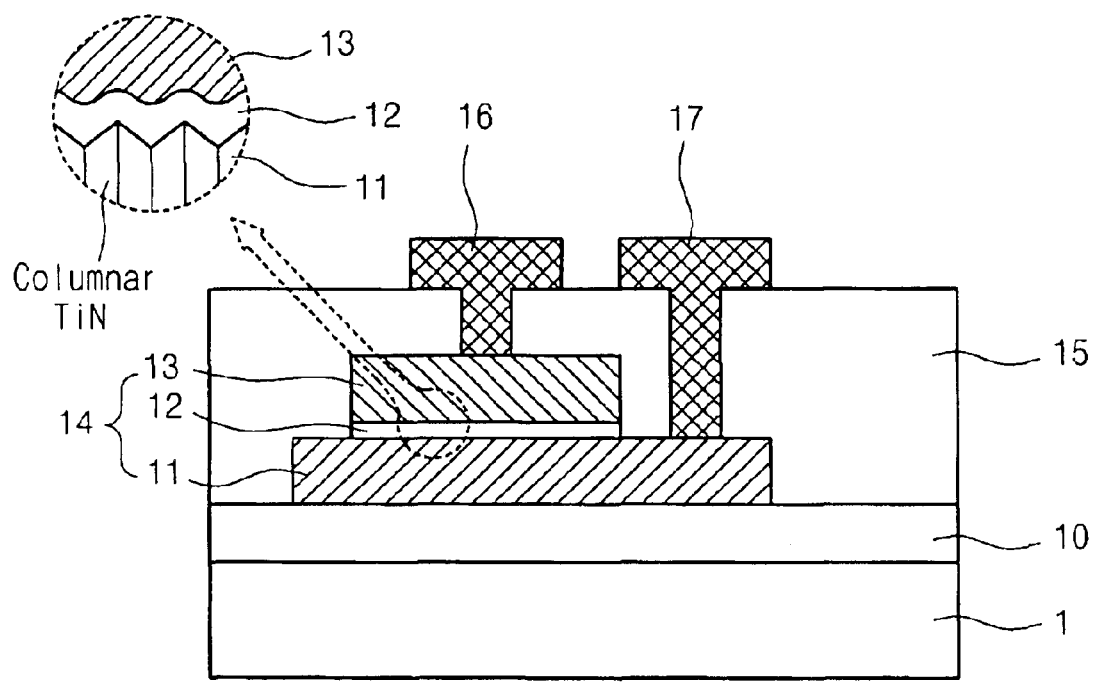
FIG. 1 is a cross-sectional view of an MIM capacitor according to a prior art.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2D are explanatory views in cross section illustrating a method for forming an MIM capacitor according to an embodiment of the present invention.

Figure 2A:
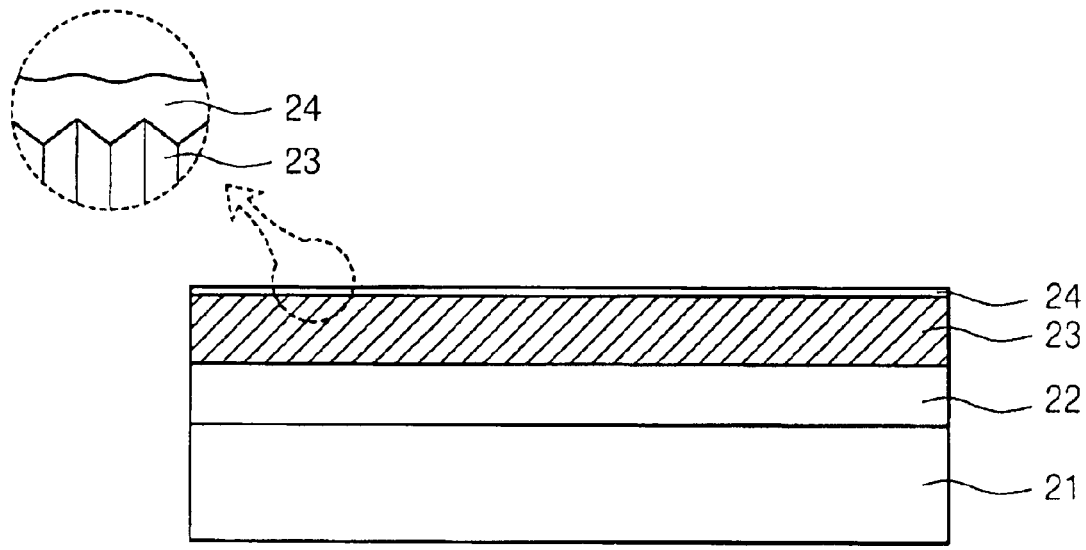
FIGS. 2A to 2D are explanatory views in cross-section illustrating a method for forming an MIM capacitor according to an embodiment of the present invention.

Referring to FIG. 2A, a base layer 22, which includes a copper pattern or an aluminum pattern (not shown) formed by a dual damascene process, is formed on a semiconductor substrate 21. Afterward, a first metallic layer, i.e., a barrier layer 23 of TiN, TaN, Ti or Ta, is deposited on the base layer 22, and then a first nitride layer 24 is deposited on the barrier layer 23 with a thickness within a range of 10 to 200 Å by a PECVD (plasma enhanced chemical vapor deposition) process performed at a temperature range of 300 to 500 degrees Celsius.

Here, since the barrier metallic layer has a poor surface roughness with respect to the fact that the metallic barrier layer of TiN, TaN, Ti or Ta has a columnar structure the first nitride layer 24 is formed in order to mitigate surface roughness. Tn this respect, a silicon oxide ($SiO_2$) layer or an aluminum oxide ($Al_2O_3$) layer can be used instead of the nitride layer.

Figure 2B:
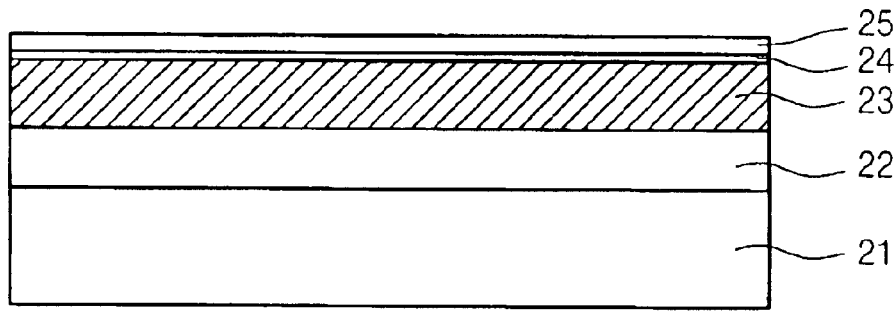

Referring to FIG. 2B, a $Ta_2O_5$ layer 25 having a high dielectric constant is deposited as a dielectric layer on the first nitride layer 24. The Ta$_2$O$_5$ layer 25 has a thickness within a range of about 30 Å to about 1000 Å. Then, in order to ensure the material property of the Ta$_2$O$_5$ layer 25, post treatment, such as an O$_2$-plasma treatment or an O$_3$-annealing, is performed. Here, an O$_2$-plasma treatment is carried out with a power of between 200 and 300 watts for a time of between 10 and 300 seconds using O, N$_2$, Ar gas. Also, the O$_3$-annelaing is carried out at a temperature of between 200 and 500 degrees Celsius for a time of between 1 and 300 minutes.

In such a post treatment, the surface of the metallic barrier layer of the present invention will not be oxidized because the first nitride layer 24 is formed on the metallic barrier layer 23, while in contrast, the surface of the metallic barrier layer of the prior art is oxidized.

As a material with high dielectric constant, a HfO$_2$, HfON, BST, ZrO$_2$, CeO$_2$, TiO$_2$, Y$_2$O$_3$ or ternary metallic oxide layer can be used instead of the Ta$_2$O$_5$ layer 25.

Figure 2C:
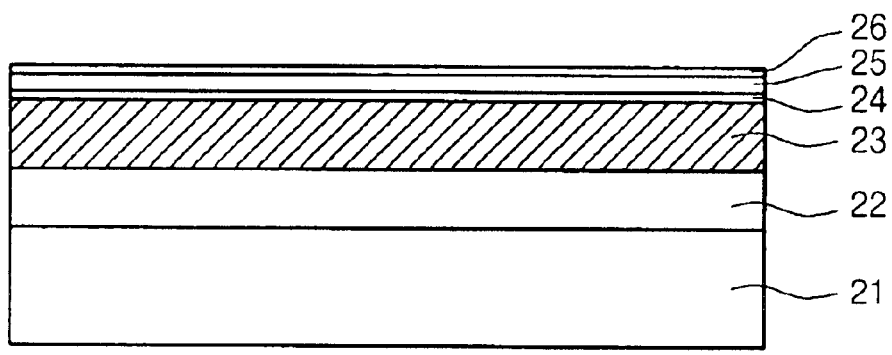

Referring to FIG. 2C, on the Ta$_2$O$_5$ layer 25 is deposited a second nitride layer 26 with a thickness of between 10 and 200 Å by the PECVD process performed at a temperature of between 300 and 500 degrees Celsius.

Here, the second nitride layer 26 is formed so as to provide symmetry. In particular, the band gap energy of the second nitride layer 26 is greater than that of the Ta$_2$O$_5$ layer 25, so that the movement of electrons and holes is interrupted. As a result, the second nitride layer 26 improves the ability of the capacitor to prevent leakage current.

Also, if the second nitride layer 26 is deposited on the Ta$_2$O$_5$ layer 25, the post treatment followed by the deposition of the Ta$_2$O$_5$ layer 25 may be omitted, because the reduction in leakage current due to the band gap is ensured.

Figure 2D:
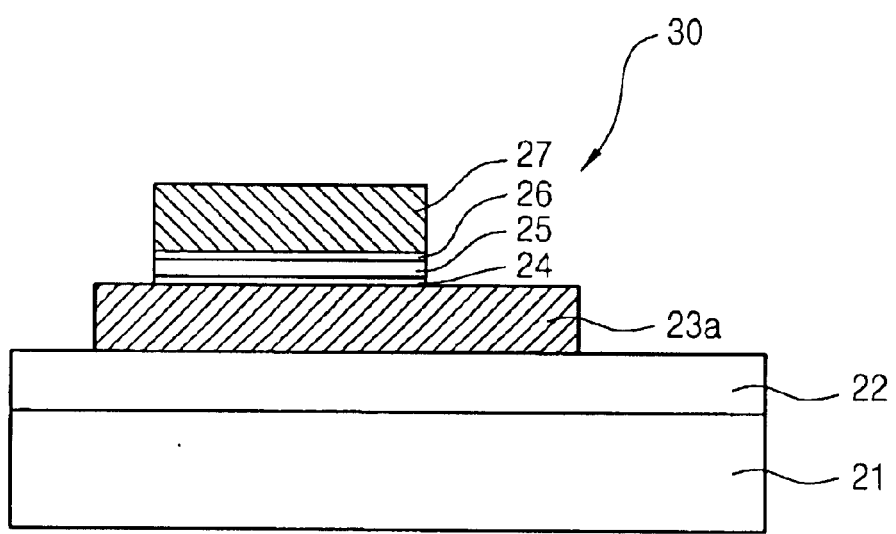

Referring to FIG. 2D, a second metallic layer, which is used for the upper electrode and is made from TiN, TaN, Ti or Ta, is deposited on the second nitride layer 26 by a CVD or a sputtering process. Thereafter, an upper electrode 27 is formed by patterning the second metallic layer, the second nitride layer, the Ta$_2$O$_5$ layer and the first nitride layer. Also, the lower electrode 23a is formed by patterning the metallic barrier layer. As a result, the MIM capacitor 30 of the present invention is formed.

Subsequently, though not shown in the drawings, metallic wires are formed in contact with the lower electrode and the upper electrode by a wiring process, and thus the production of the MIM capacitor is completed.

As described above, the process of producing the MIM capacitor of the present invention can mitigate surface roughness by interposing a nitride layer between the lower electrode and the upper electrode. Further, since oxidization on the surface of the lower electrode is prevented in the post treatment of the dielectric layer, it is possible to improve the ability of the capacitor to prevent leakage current as well as improve the polarity. These improvement of leakage current also improve the RF and analog characterizations, which are VCC, TCC and so on.

Figure 3:
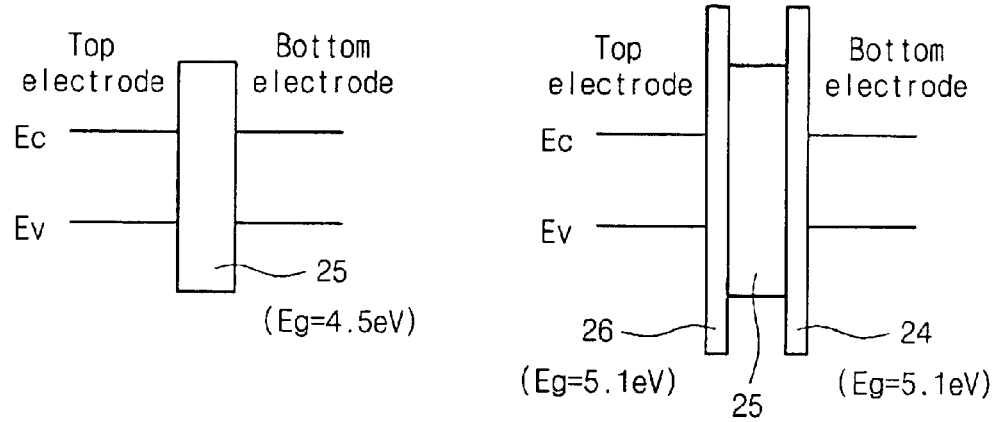
FIG. 3 is an explanatory view illustrating an energy band gap of the MIM capacitor according to the present invention.

Also, because the MIM capacitor of the present invention has nitride layers interposed between the lower electrode and the dielectric layer as well as between the dielectric layer and the upper electrode, respectively, it is possible to improve the ability of the capacitor to prevent leakage current due to a band gap energy effect as shown in FIG. 3. In other words, while the band gap energy of the Ta$_2$O$_5$ layer 25 is 4.5 eV, that of the nitride layer deposited by the PECVD process is 5.1 eV. Accordingly, obstruction to the passage of the electrons and the holes is relatively high, so that it is possible to gain an effect of reducing the leakage current.

Also, since the nitride layers are respectively interposed between the lower electrode and the dielectric layer as well as between the dielectric layer and the upper layer, the post treatment for the dielectric layer, such as the Ta$_2$O$_5$ layer 25 may be omitted.

Figure 4:
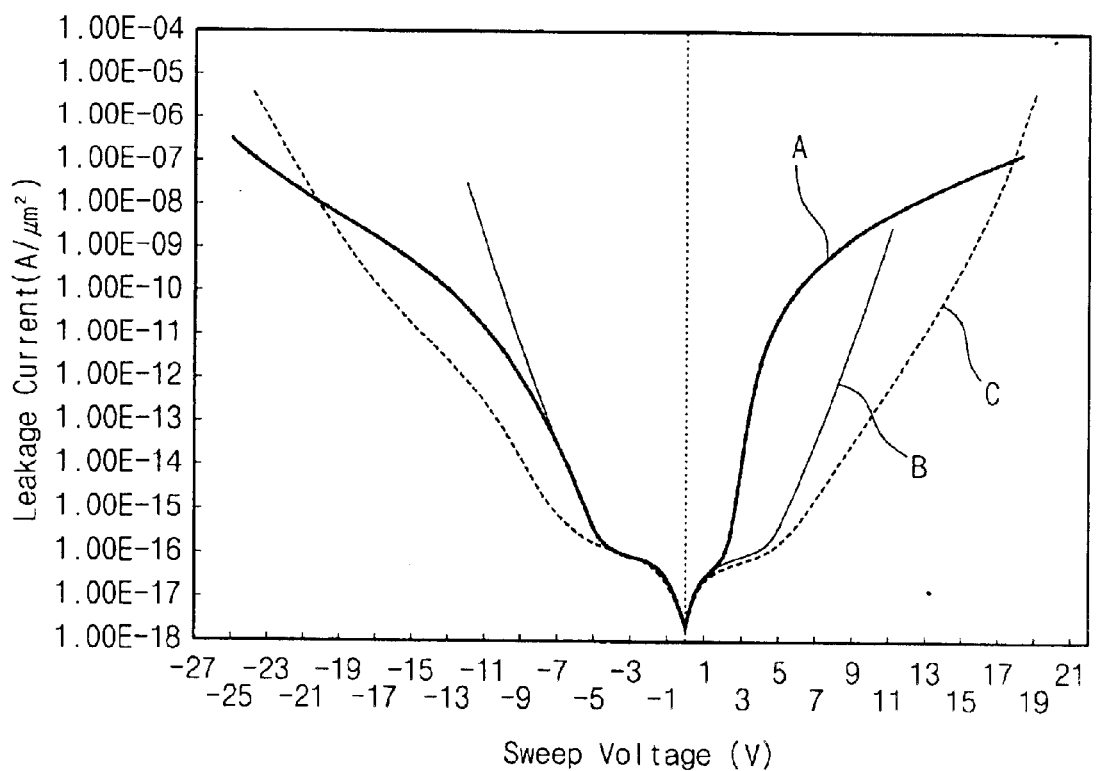
FIG. 4 is a graph illustrating leakage current (I) to voltage (V) characteristic in an MIM capacitor.

FIG. 4 is a graph illustrating leakage current versus voltage characteristics. It shows a comparison of a first case in which a positive (+) bias is applied to the upper electrode to a second case in which a negative (−) bias is applied to the upper electrode.

When only the dielectric layer is present without an interposed nitride layer, as indicated with curve A, there exists a great difference. When the nitride layer is interposed only between the lower electrode and the dielectric layer, as indicated with curve B, the difference is reduced. When the nitride layers are interposed between the lower electrode and the dielectric layer as well as between the dielectric layer and the upper electrode, respectively, as indicated with curve C, the difference is reduced.

Accordingly, the MIM capacitor according to the present invention improves the ability of the capacitor to prevent leakage current as well as improving the polarity, by interposing the nitride layers above and below the dielectric layer by the PECVD process.

As described before, the present invention improves the polarity and the ability to prevent leakage current by interposing a nitride layer between the lower electrode and the dielectric layer as well as between the dielectric layer and the upper electrode by a PECVD process, thus improving the performance of the MIM capacitor as well as the reliability thereof.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an MIM capacitor on a semiconductor substrate having a base layer, the method comprising steps of:

forming a first metallic layer on the base layer;

forming a first middle layer of an aluminum oxide layer on the first metallic layer in order to improve the surface roughness of the first metallic layer and prevent oxidization thereof;

forming a second middle layer from one of HfO$_2$, HfON, BST, ZrO$_2$, CeO$_2$, TiO$_2$, and Y$_2$O$_3$ on the first middle layer;

forming a third middle layer of an aluminum oxide layer on the second middle layer in order to increase band gap energy;

forming a second metallic layer on the third middle layer.

2. A method for fabricating an MIM capacitor as claimed in claim 1, wherein each of the first end second metallic layers is made from one of, TI and Ta.

3. A method for fabricating an MIM capacitor as claimed in claim 1, wherein the second and third layers are deposited with a thickness of between 10 and 200 Å by a PECVD process performed at a temperature of between 300 and 500 degrees Celsius.

4. A method for fabricating an MIM capacitor as claimed in claim 1 wherein the second middle layer is formed by utilizing an O$_2$-plasma treatment process or an O$_3$-annealing process.

* * * * *